United States Patent
Sasaki et al.

(10) Patent No.: US 10,249,478 B2
(45) Date of Patent: Apr. 2, 2019

(54) SUBSTRATE PROCESSING APPARATUS

(71) Applicant: Tokyo Electron Limited, Tokyo (JP)

(72) Inventors: Nobutaka Sasaki, Miyagi (JP);
Takashi Kitazawa, Miyagi (JP);
Akihiro Yoshimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 90 days.

(21) Appl. No.: 14/570,116

(22) Filed: Dec. 15, 2014

(65) Prior Publication Data
US 2015/0179415 A1 Jun. 25, 2015

(30) Foreign Application Priority Data

Dec. 19, 2013 (JP) ................. 2013-262207

(51) Int. Cl.
*C23C 16/00* (2006.01)
*H01J 37/32* (2006.01)

(52) U.S. Cl.
CPC .. *H01J 37/32651* (2013.01); *H01J 37/32091* (2013.01); *H01J 37/32477* (2013.01)

(58) Field of Classification Search
CPC ............................................. H01J 37/32651
USPC ....................................................... 118/715
See application file for complete search history.

(56) References Cited

U.S. PATENT DOCUMENTS

| | | | | |
|---|---|---|---|---|
| 4,294,869 A * | 10/1981 | Bassompierre-Sewrin | | B05C 7/08 118/105 |
| 4,896,904 A * | 1/1990 | Gadsden | ............. | B29C 61/0616 156/86 |
| 5,204,145 A * | 4/1993 | Gasworth | ............. | C23C 16/276 117/929 |
| 5,772,770 A * | 6/1998 | Suda | ................... | C23C 16/4401 118/719 |
| 5,861,546 A * | 1/1999 | Sagi | ......................... | G01F 1/44 137/599.13 |
| 6,129,808 A * | 10/2000 | Wicker | ................. | H01J 37/321 118/723 E |
| 8,844,577 B2 * | 9/2014 | Kiest, Jr. | ............. | F16L 55/1653 138/104 |
| 2002/0014206 A1 * | 2/2002 | Mudd | .................. | F16K 31/007 118/715 |

(Continued)

FOREIGN PATENT DOCUMENTS

| | | |
|---|---|---|
| JP | 2009-123946 | 6/2009 |
| JP | 2010-251464 | 11/2010 |

*Primary Examiner* — Keath T Chen
(74) *Attorney, Agent, or Firm* — IPUSA, PLLC

(57) ABSTRACT

A substrate processing apparatus includes a chamber including a process chamber for performing a process on a substrate by a gas introduced thereto and an exhaust chamber for evacuating the gas in the process chamber, a shield member for separating the process chamber from the exhaust chamber provided in at least a part of a neighborhood of a side wall of the chamber, and a hollow relay member penetrating through the shield member for communicating the chamber with a pipe connected to a pressure gauge outside the chamber. The relay member is configured to receive a first gas flowing from the chamber into the relay member. The first gas has a first conductance. The first conductance is greater than a second conductance of a second gas flowing from the exhaust chamber into a gap between the relay member and the side wall of the chamber.

6 Claims, 3 Drawing Sheets

(56) References Cited

U.S. PATENT DOCUMENTS

| | | | |
|---|---|---|---|
| 2003/0118731 A1* | 6/2003 | He | C04B 41/009 |
| | | | 427/307 |
| 2003/0227258 A1* | 12/2003 | Strang | H01J 37/32449 |
| | | | 315/111.21 |
| 2009/0017227 A1* | 1/2009 | Fu | H01J 37/32357 |
| | | | 427/569 |
| 2014/0260544 A1* | 9/2014 | Rasheed | H01J 37/3244 |
| | | | 73/31.04 |

* cited by examiner

SUBSTRATE PROCESSING APPARATUS

CROSS-REFERENCE TO RELATED APPLICATIONS

This patent application is based upon and claims the benefit of priority of Japanese Patent Application No. 2013-262207, filed on Dec. 19, 2013, the entire contents of which are incorporated herein by reference.

BACKGROUND OF THE INVENTION

1. Field of the Invention

The present invention relates to a substrate processing apparatus.

2. Description of the Related Art

A substrate processing apparatus includes a chamber including a process chamber for performing a desired process such as an etching on a substrate by an introduced gas, and an exhaust chamber for evacuating a gas in the process chamber. A deposit is generated accompanying the etching process. The generated deposit adheres on an inner wall of the chamber, and becomes a cause of generating dusts such as particles.

Therefore, a deposition shield is provided near the inner wall of the chamber, and the inner wall is covered with the deposition shield in order to prevent the deposit from adhering on the inner wall of the chamber. The deposition shield is replaced when the inside of the chamber is cleaned, thereby preventing the dusts from being generated inside the chamber.

In the meantime, when performing a desired process by the substrate processing apparatus, a pressure inside the chamber needs to be controlled so as to agree with process conditions. To achieve this, as disclosed in Japanese Laid-Open Patent Application Publication No. 2010-251464 and Japanese Laid-Open Patent Application Publication No. 2009-123946, measuring the pressure inside the chamber by using a pressure gauge installed outside the chamber and controlling the pressure inside the chamber based on the measured pressure value are performed.

However, a position where the deposition shield is arranged changes depending on a process performed in the chamber. Moreover, a distance may be created between the deposition shield and the inner wall of the chamber depending on the position where the deposition shield is arranged, and a space on the exhaust chamber side may be created between the deposition shield and the inner wall of the chamber.

In this case, when the pressure inside the process chamber is measured by using the pressure gauge outside the chamber, the pressure inside the process chamber is measured through the space on the exhaust chamber side. As a result, the measurement by the pressure gauge is influenced by the pressure of the exhaust chamber, and the measured value by the pressure gauge may take a value deviated from the actual pressure in the process chamber.

SUMMARY OF THE INVENTION

Accordingly, in response to the above discussed problems, embodiments of the present invention aim to provide a substrate processing apparatus that precisely measures a pressure of a process chamber.

According to one embodiment of the present invention, there is provided a substrate processing apparatus that includes a chamber including a process chamber for performing a process on a substrate by a gas introduced thereto and an exhaust chamber for evacuating the gas in the process chamber, a shield member for separating the process chamber from the exhaust chamber provided in at least a part of a neighborhood of a side wall of the chamber, and a hollow relay member penetrating through the shield member for communicating the chamber with a pipe connected to a pressure gauge outside the chamber. The relay member is configured to receive a first gas flowing from the chamber into the relay member. The first gas has a first conductance. The first conductance is greater than a second conductance of a second gas flowing from the exhaust chamber into a gap between the relay member and the side wall of the chamber.

Additional objects and advantages of the embodiments are set forth in part in the description which follows, and in part will become obvious from the description.

DETAILED DESCRIPTION OF THE PREFERRED EMBODIMENTS

Figure 1:
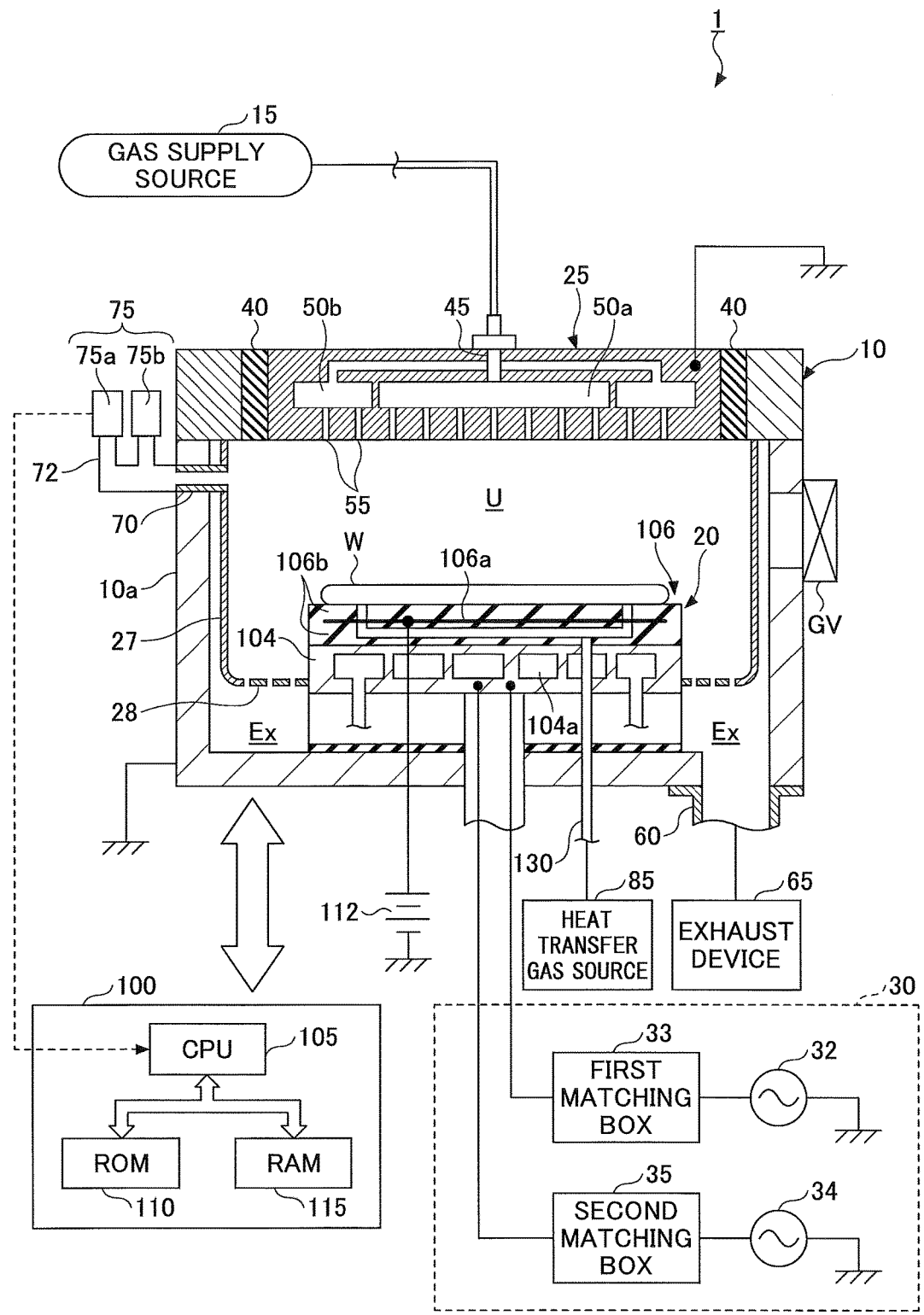
FIG. 1 is a vertical cross-sectional view of a substrate processing apparatus according to an embodiment of the present invention.

A description is given below of embodiments of the present invention, with reference to accompanying drawings. Note that elements having substantially the same functions or features may be given the same reference numerals and overlapping descriptions thereof may be omitted.

[Overall Configuration of Substrate Processing Apparatus]

To begin with, a description is given below by citing an example of a substrate processing apparatus according to an embodiment of the present invention. FIG. 1 is a vertical cross-sectional view of the substrate processing apparatus according to the embodiment of the present invention. The substrate processing apparatus 1 of the embodiment includes a chamber 10 made of a conductive material such as aluminum or the like. The chamber 10 is electrically grounded.

At a location close to a side wall 10a of the chamber 10, a deposition shield 27, which is coated with aluminum or alumite, or coated with magnesium oxide (MgO), yttria ($Y_2O_3$) or the like having high plasma resistance, is arranged along the side wall 10a. The deposition shield 27 is replaced when cleaning the inside of the chamber 10, thereby preventing dusts such as particles from being generated inside the chamber 10. The deposition shield 27 separates a process chamber U for processing a semiconductor wafer W (which is hereinafter called just a "wafer W") by a gas introduced into the chamber 10 from an exhaust chamber Ex for evacuating a gas inside the process chamber U.

The substrate processing apparatus 1 includes a lower electrode 20 and an upper electrode 25 arranged in parallel so as to face each other. The lower electrode 20 also functions as a pedestal for placing a wafer W thereon. A process space between the lower electrode 20 and the upper electrode 25 facing each other is the process chamber U for performing a desired process on the wafer W. A gas supply source 15 for supplying a gas into the chamber 10 is coupled to the upper electrode 25, and an etching process and the like are performed on the wafer W by using the gas introduced into the process chamber U from the gas supply source 15.

A baffle plate 28 is provided between the process chamber U and the exhaust chamber Ex. The baffle plate 28 adjusts a flow of the gas evacuated from the process chamber U to the exhaust chamber Ex. The deposition shield 27 is arranged near the side wall 10a and above the baffle plate 28. The deposition shield 27 only has to be provided in at least a part of a neighborhood of the side wall 10a of the exhaust chamber Ex. The deposition shield 27 is an example of a shield member that separates the process chamber U from the exhaust chamber Ex.

An electrostatic chuck 106 for electrostatically attracting the wafer W is provided in an upper surface of the pedestal (lower electrode 20). The electrostatic chuck 106 is structured so as to have a chuck electrode 106a between insulators 106b or within insulator 106b. A direct voltage source 112 is connected to the chuck electrode 106a. When the direct voltage source 112 applies a direct voltage to the chuck electrode 106a, the wafer W is attracted to the electrostatic chuck 106 by a Coulomb force.

The pedestal (lower electrode 20) is supported by a support 104. A coolant passage 104a is formed within the support 104. For example, cooling water or the like is circulated through the coolant passage 104a as a coolant depending on the intended use.

A heat transfer gas supply source 85 supplies a heat transfer gas such as helium gas (He) or argon gas (Ar) or the like to a back surface of the wafer on the electrostatic chuck 106 through a gas supply line 130. This structure causes a temperature of the electrostatic chuck 106 to be controlled by the cooling water circulating through the coolant passage 104a and the transfer gas supplied to the back surface of the wafer W. As a result, the wafer W can be controlled to become a predetermined temperature.

A power supply device 30 for supplying dual frequency superimposed power is connected to the lower electrode 20. The power supply device 30 includes a first high frequency power source 32 for supplying a first high frequency power (high frequency power for plasma generation) of a first frequency and a second high frequency power source 34 for supplying a second high frequency power (high frequency power for bias voltage generation) of a second frequency that is lower than the first frequency. The first high frequency power source 32 is connected to the lower electrode 20 through a first matching box 33. The second high frequency power source 34 is connected to the lower electrode 20 through a second matching box 35. The first high frequency power source 32, for example, supplies the first high frequency power of 40 MHz. The second high frequency power source 34, for example, supplies the second high frequency power of 3.2 MHz.

Each of the first and second matching boxes 33 and 35 causes load impedance of each of the first and second high frequency power sources 32 and 34, respectively, to match internal (or output) impedance thereof. Each of the first and second matching boxes 33 and 35 functions to cause the load impedance of each of the first and second high frequency power sources 32 and 34, respectively, to appear the same as the internal impedance thereof when plasma is generated in the chamber 10.

The upper electrode 25 is attached to a ceiling part of the chamber 10 by way of a shield ring 40 coating a peripheral wall thereof. The upper electrode 25 may be electrically grounded as illustrated in FIG. 1, or may be configured to receive a predetermined direct-current (DC) voltage by being connected to a variable direct-current power source that is not illustrated in the drawings.

A gas introduction port 45 for introducing a gas from the gas supply source 15 is formed in the upper electrode 25. A diffusion chamber 50a located on a central side and a diffusion chamber 50b located on an edge side for diffusing a gas diverged from the gas introduction port 45 and introduced thereto are provided inside the upper electrode 25. Such a configuration enables a proportion of the gas supplied to the diffusion chamber 50a on the central side and the diffusion chamber 50b on the edge side to be controlled.

Many gas supply holes 55 are formed in the upper electrode 25 to supply the gas from the diffusion chambers 50a and 50b into the chamber 10. Each of the gas supply holes 55 supplies the gas to a space between the wafer W placed on the lower electrode 20 and the upper electrode 25.

An exhaust port 60 is formed in a bottom surface of the chamber 10, and an exhaust device 65 is connected to the exhaust port 60. The exhaust chamber Ex evacuates the gas inside the process chamber U to the outside by using the exhaust device 65. This makes it possible to maintain an atmosphere inside the chamber 10 at a predetermined degree of vacuum. A gate valve GV is provided at the side wall 10a of the chamber 10. The gate valve GV opens and closes a carry-in/out opening when carrying the wafer in/out of the chamber 10.

A control unit 100 for controlling the entire operation of the apparatus is provided in the substrate processing apparatus 1. The control unit 100 includes a CPU (Central Processing Unit) 105, a ROM (Read Only Memory) 110 and a RAM (Random Access Memory) 115. The CPU 105 performs a desired process such as an etching process, a cleaning treatment and the like in accordance with a variety of recipes stored in the ROM 110 or the RAM 115. Each of the recipes provides a process time, a pressure (evacuation of the gas), a high frequency power or voltage, flow rates of a variety of process gases, a temperature inside the chamber (an upper electrode temperature, a side wall temperature of the chamber, an ESC temperature and the like) and the like that constitute control information of the apparatus under process conditions. The recipe indicating these programs and the process conditions may be stored in a hard disk or a semiconductor memory, or may be set at a predetermined location of a storage area in a state of being stored in a storage medium such as a CD-ROM, DVD or the like that is readable by a portable computer. The function of the control unit 100 may be implemented by executing software or by operating hardware.

Two capacitance manometers 75a and 75b (which are also collectively called a capacitance manometer 75) are installed outside the side wall 10a of the chamber 10. The capacitance manometer 75a can measure a pressure in a range of 0 mT to 10 T (i.e., 0 Pa to 1333 Pa). The capacitance manometer 75b can measure a pressure in a range of 250 mT to 0 mT (i.e., 33.3 Pa to 0 Pa). In the embodiment, two of the capacitance manometers 75a and 75b having different measurement ranges are installed, but the pressure gauge is not limited to this embodiment, and one or more than two of the capacitance manometer(s) 75 may be installed.

The capacitance manometers 75a and 75b are connected to a gas pipe 72. The gas pipe 72 is in communication with the process chamber U through a sleeve 70. The sleeve 70 is arranged above the baffle plate 28 and in the side wall 10a of the chamber 10. This allows the capacitance manometers 75a and 75b to measure the pressure inside the process chamber U through the gas pipe 72 and the sleeve 70. The control unit 100 acquires the measured pressure and controls the pressure inside the process chamber U to make a target pressure based on the measured pressure.

As discussed above, the description has been given of the example of the overall configuration of the substrate processing apparatus 1 according to the embodiment. The configuration of the substrate processing apparatus 1, however, is not limited to the example. For example, the substrate processing apparatus 1 may be an apparatus configured to include a magnet installed outside the chamber 10 in addition to the configuration of the substrate processing apparatus 1 as illustrated in FIG. 1. Also, the substrate processing apparatus 1 may be an apparatus configured to supply high frequency power of a dual frequency to the lower electrode 20, to supply high frequency power of a single frequency and DC power to the upper electrode 25, and to have a magnet for plasma control provided outside the substrate processing apparatus 1. In addition, the substrate processing apparatus 1 may be an apparatus configured to supply high frequency power to at least one of the upper electrode 25 and the lower electrode 20.

[Sleeve]

Figure 2:
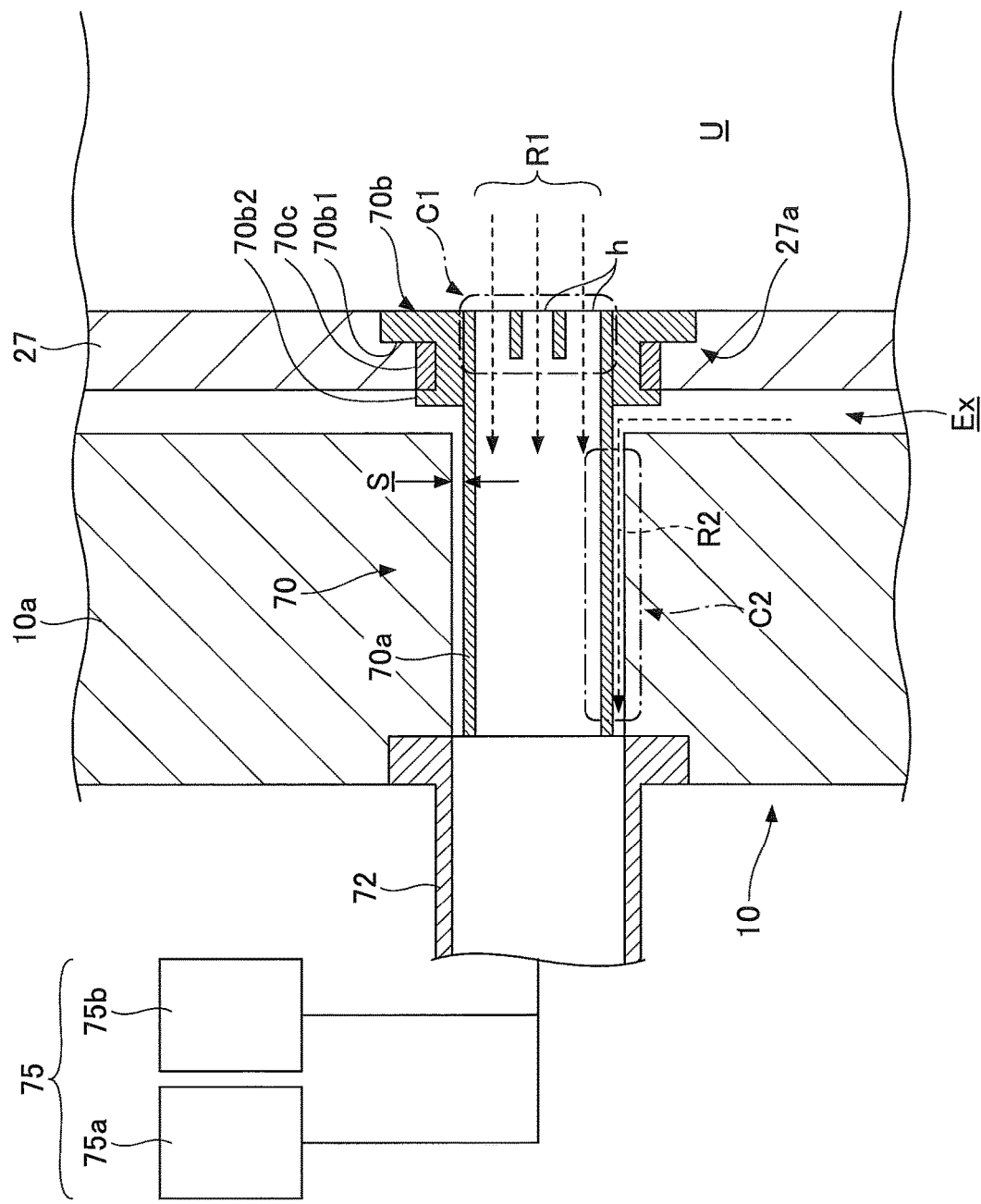
FIG. 2 is an enlarged view of a sleeve and its periphery according to an embodiment of the present invention.

Next, a description is given below of details of a configuration and arrangements of the sleeve 70 with reference to FIGS. 2 and 3A through 3D. FIG. 2 is an enlarged view of the sleeve 70 and its periphery according to an embodiment. FIGS. 3A through 3D are diagrams mainly illustrating a gas introduction port of the sleeve 70 according to the embodiment.

When the capacitance manometer 75 is installed to be coupled to the side wall 10a of the chamber 10, a predetermined distance may be created from a location in which the capacitance manometer 75 is installed to the process chamber U. More specifically, as illustrated in FIG. 2, a space in communication with the exhaust chamber Ex may be formed between the deposition shield 27 and the side wall 10a of the chamber 10. In this case, the pressure measured by the capacitance manometer 75 may be influenced by a pressure of the exhaust chamber Ex. As a result, the measurement value of the capacitance manometer 75 may be shifted from the actual pressure of the process chamber U. In the meantime, an arranged position of the deposition shield 27 varies depending on a process performed in the process chamber U.

Therefore, in the embodiment, the sleeve 70 for the capacitance manometer 75 is installed in a predetermined position. This allows the capacitance manometer 75 to precisely measure the actual pressure of the process chamber U.

Figure 3A:
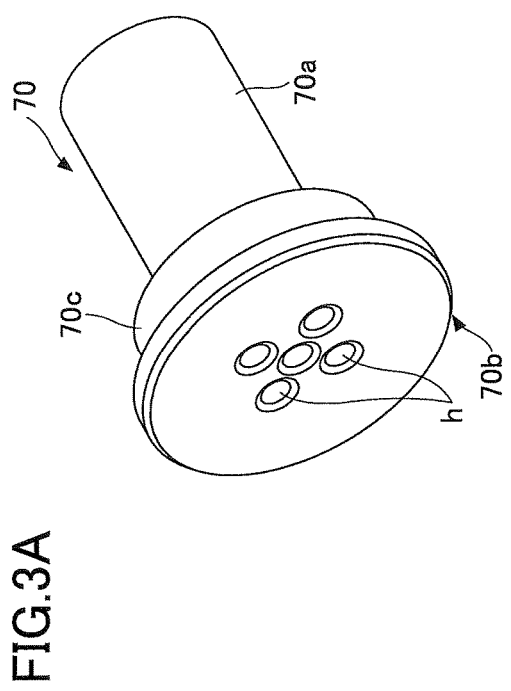
FIGS. 3A through 3D are diagrams illustrating gas introduction openings of sleeves according to embodiments of the present invention.

The sleeve 70 is an example of a relay member used to place the capacitance manometer 75 in communication with the process chamber U. As illustrated in FIGS. 2 and 3A, the sleeve 70 includes a tubular element 70a. A tip division 70b of the tubular element 70a has a thick wall and penetrates a through-hole formed in the deposition shield 27. Moreover, the tubular element 70a is inserted into a through-hole formed in the side wall 10a of the chamber 10. This causes an end part of the sleeve 70 to communicate with the gas pipe 72. The tip division 70b has a plurality of gas holes h therein, by which the process chamber U communicates with the inside of the sleeve 70 and the gas pipe 72.

The tip division 70b includes a step portion 70b1 and a projection portion 70b2. The step portion 70b1 engages with a step part 27a formed in the though-hole of the deposition shield 27. In this state, the sleeve 70 is fixed to the deposition shield 27 by a fixing member 70c provided between the step portion 70b1 and the projection portion 70b2 in a state of catching the deposition shield 27 by the projection portion 70b2. Here, the method of fixing the sleeve 70 includes a method of providing a screw structure in the sleeve 70 and screwing the sleeve 70 into the deposition shield 27 for fixing, in addition to a method of hitching the sleeve 70 to the deposition shield 27 by a pin or the like. The method of fixing the sleeve 70 is not limited to these, but any structure and method of fixing are available as long as the position of the sleeve 70 can be fixed so as not to move except for the case of maintenance of the substrate processing apparatus 1 and the like.

[Conductance]

The capacitance manometer 75 provided outside the chamber 10 measures a pressure of the process chamber U through the gas pipe 72 and the sleeve 70. As illustrated in FIG. 2, in such a configuration, the pressure measured by the capacitance manometer 75 is determined based on the conductance of a gas detected from two paths through the gas pipe 72.

A first path R1 is a path for a gas flowing from a plurality of holes h to the sleeve 70 and the gas pipe 72 to be detected by the capacitance manometer 75. Conductance of the gas flowing from the path R1 is expressed as "conductance C1."

A second path R2 is a path for a gas flowing from the exhaust chamber Ex to the gas pipe 72, with a gap S being defined between the tubular element 70a inserted into the through-hole formed in the side wall 10a of the chamber 10 and the side wall 10a of the chamber 10 (the through-hole). This gas flow is detected by the capacitance manometer 75. Conductance of the gas flowing from the path R2 is expressed as "conductance C2."

The gas flowing through the path R1 is a gas flowing from the process chamber U. The gas flowing through the path R2 is a gas flowing from the exhaust chamber Ex. The capacitance manometer 75 measures the pressure based on the conductance of the gas. Hence, when a ratio of the conductance C2 of the gas flowing through the path R2 to the conductance C1 of the gas flowing through the path R1 increases, the measurement value of the capacitance manometer 75 is influenced by the pressure of the exhaust chamber Ex and becomes a value shifted from the actual pressure of the process chamber U. Accordingly, the conductance C2 is preferred to be a value close to "0."

The gap S, however, is difficult to be made "0" in order to perform the maintenance and the like. Accordingly, the conductance C2 of the gas is unlikely to become "0."

The conductance C1 is conductance proportional to the pressure of the process chamber U, and the conductance C2 is conductance proportional to the pressure of the exhaust chamber Ex. Hence, when the conductance C2 is greater than the conductance C1, the capacitance manometer 75 mainly measures the pressure of the exhaust space and cannot measure the actual pressure of the process chamber U.

Accordingly, in order to measure the actual pressure of the process chamber U, the conductance C1 of the gas flowing from the process chamber U to the capacitance manometer 75 needs to be greater than the conductance C2 of the gas flowing from the exhaust chamber Ex to the capacitance manometer 75 through the gap S.

In order to increase a degree of accuracy of the measurement value of the capacitance manometer 75, the ratio of the gas conductance C1 to the gas conductance C2 is preferred to be equal to or higher than 1.1. In order to further increase the degree of accuracy of the measurement value of the capacitance manometer 75, the ratio of the gas conductance C1 to the gas conductance C2 is preferred to be equal to or higher than 2.0.

[Shape and Number of Gas Holes]

Figure 3D:
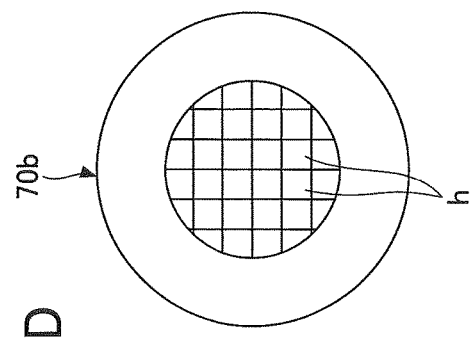
Figure 3C:
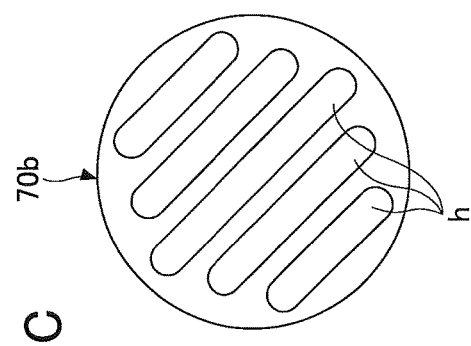
Figure 3B:
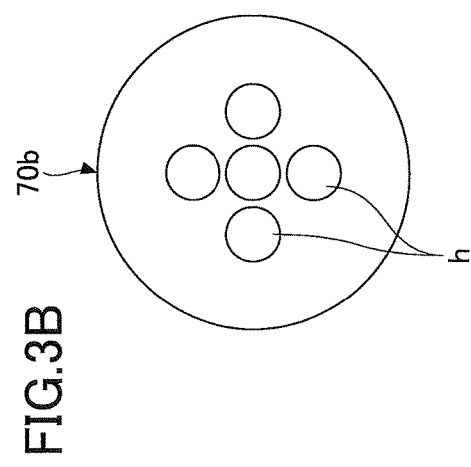

In the embodiment, the number and a shape of the gas holes h of the sleeve 70 are determined so that the gas conductance C1 is greater than the gas conductance C2. As an example of the shape of the gas holes h, for example, as illustrated in FIGS. 3A and 3B, the sleeve 70 may have one circular gas hole h in the center and four circular gas holes h therearound at equal intervals formed therein. As another example, for example, as illustrated in FIG. 3C, the gas holes h having a slit shape may be formed in the sleeve 70. Also, as another example, for example, as illustrated in FIG. 3D, the gas holes h having a shape like a metallic gauze may be formed in the sleeve 70.

The number and the shape of the gas holes h, however, is not limited to these examples. As long as the gas holes h are formed to have the ratio of the gas conductance C1 to the gas conductance C2 equal to or higher than 1.1, any shape is available and the number of the gas holes h is not limited.

[Calculation of the Conductance]

Finally, a description is given below of a method of calculating the conductance. In the case of a molecular flow, the conductance Ca of a gas other than air at the temperature of 20 degrees Celsius is expressed by the following formula when the conductance of the air at the temperature of 20 degrees Celsius is C.

$$Ca = \sqrt{\frac{T}{293.15}} \times \sqrt{\frac{28.8}{M}} \times C \quad (20°\ C.\ \text{AIR}) \qquad \text{FORMULA 1}$$

Here, the letter "T" in formula 1 represents the target gas temperature, and the letter "M" represents the molecular weight of the gas. An example of calculating the actual conductance C1 and C2 by using the above formula 1 is taken as follows.

The substrate processing apparatus 1 was configured to supply high frequency power of a dual frequency to the lower electrode 20, to supply high frequency power of a single frequency and DC power to the upper electrode 25, and to have a magnet for plasma control provided outside the chamber 10 and the sleeve 70.

In this case, under conditions of using argon gas (Ar) as the gas species at the gas temperature of 20 degrees Celsius, the conductance C1 was calculated as 4.62 l/s based on the above formula 1. Also, the conductance C2 was calculated as 0.23 l/s.

From the calculation results, a ratio of the conductance C1 to the conductance C2 (C1/C2) was calculated as 20.09. This calculation result could ensure more than ten times a margin relative to "a ratio of the conductance C1 to the conductance C2 equal to or higher than 2 of preferred conditions." The result has proved that the substrate professing apparatus 1 according to the embodiments can accurately measure the pressure of the process chamber U by the capacitance manometer 75 by providing the sleeve 70.

In this manner, according to the embodiments of the present invention, a substrate processing apparatus can be provided that precisely measures a pressure of a process space inside a process chamber.

Hereinabove, although the substrate processing apparatus and the method for detecting the abnormality of the ozone gas concentration have been described according to the embodiments, the present invention is not limited to the embodiments and various modifications and improvements can be made without departing from the scope of the invention. Moreover, the embodiments and modifications can be combined as long as they are not contradictory to each other.

For example, a substrate processing apparatus capable of attaching the sleeve 70 in the present invention may be, for example, a CVD apparatus using a radial line slot antenna, a capacitively coupled plasma (CCP: Capacitively Coupled Plasma) apparatus, an inductively coupled plasma (ICP: Inductively Coupled Plasma) apparatus, a helicon wave excited plasma (HWP: Helicon Wave Plasma) apparatus, an electron cyclotron resonance plasma (ECR: Electron Cyclotron Resonance Plasma) apparatus and the like.

A substrate processing apparatus capable of attaching the sleeve 70 in the present invention can use a capacitively coupled plasma (CCP: Capacitively Coupled Plasma) generation unit, an inductively coupled plasma (ICP: Inductively Coupled Plasma) generation unit, a helicon wave excited plasma (HWP: Helicon Wave Plasma) generation unit, a microwave excited surface wave plasma generation unit including microwave plasma generated from a radial line slot antenna or SPA (Slot Plane Antenna) plasma, an electron cyclotron resonance (ECR: Electron Cyclotron Resonance Plasma) plasma generation unit, and a remote plasma generation unit using the above generation units.

A substrate to be processed in the substrate processing apparatus of the present invention is not limited to the (semiconductor) wafer used in the description of the embodiments, but for example, may be a large substrate for a flat panel display, a substrate for an EL (electroluminescence) device or a solar cell.

What is claimed is:

1. A substrate processing apparatus, comprising:
a chamber including a process space for performing a process on a substrate by a gas introduced thereto and an exhaust space for evacuating the gas in the process space, the exhaust space being arranged outside the process space, the chamber including a side wall with a through hole having a first diameter;
a pipe provided outside the chamber and connected to the side wall of the chamber so as to be in communication with the through hole of the chamber, the pipe being connected to a pressure gage outside the chamber;
a shield member for separating the process space from the exhaust space provided in a vicinity of the side wall of the chamber, an upper part of the exhaust space extending between the shield member and the side wall of the chamber, the shield member including a through hole and a first step portion formed around the thorough hole of the shield member; and
a hollow relay member connecting the through hole of the chamber to the through hole of the shield member to be in communication with the pipe connected to the pressure gauge outside the chamber and the process space, the hollow relay member including a cylindrical portion having a second diameter that is smaller than the first diameter of the through hole of the chamber and a second step portion having a third diameter that is larger than a diameter of the through hole of the shield member, the second diameter being an outer diameter of the cylindrical portion and the third diameter being an outer diameter of the second step portion, the cylindrical portion being provided in the through hole of the chamber, the hollow relay member forming a first flow passage therein that is in communication with the process space and fixed by the shield member, a gap between an outer surface of the cylindrical portion and an inner surface of the through hole of the chamber forming a second flow passage that is in communication with the exhaust space such that the cylindrical portion is not in contact with the inner surface of the thorough hole of the chamber, the second step portion of the relay member being engaged with the first step portion of the shield member.

2. The substrate processing apparatus as claimed in claim 1,
wherein a baffle plate for adjusting a flow of the gas evacuated from the process space to the exhaust space is provided between the process space and the exhaust space, and
the relay member is arranged above the baffle plate and in the side wall of the exhaust space.

3. The substrate processing apparatus as claimed in claim 1, wherein the second diameter is greater than a width of the gap between the outer surface of the relay member and the inner surface of the through hole of the exhaust space.

4. A substrate processing apparatus as claimed in claim 1,
wherein the pipe is connected to the side wall of the exhaust space such that an inner wall of the pipe coincides with the through hole of the exhaust space, and
wherein the second diameter is an outer diameter of the cylindrical portion of the hollow relay member, and is smaller than the first diameter of the through hole of the exhaust space and an inner diameter of the pipe, and
wherein the second flow passage is in communication with the exhaust space and the pipe.

5. The substrate processing apparatus as claimed in claim 4, wherein the pipe provided outside the chamber has an inner diameter equal to the first diameter.

6. The substrate processing apparatus as claimed in claim 1, further comprising:
a covering member to cover a tip of the hollow relay member on the shield member side, the covering member having a plurality of holes to allow the inside of the cylindrical portion and the process space to be in communication with each other, a surface of the covering member on the shield member side forming an even surface with an inner surface of the shield member.

* * * * *